United States Patent
McVicker et al.

(10) Patent No.: US 6,814,795 B2
(45) Date of Patent: Nov. 9, 2004

(54) HOT MELT CONDUCTOR PASTE COMPOSITION

(75) Inventors: Kristina H. McVicker, Vista, CA (US); Aziz S. Shaikh, San Diego, CA (US); Kenneth H. Magrini, Oceanside, CA (US); Todd K. Williams, Encinitas, CA (US); Luis C. Tolentino, San Diego, CA (US); David M. Stotka, Washsington, PA (US)

(73) Assignee: Ferro Corporation, Cleveland, OH (US)

( * ) Notice: Subject to any disclaimer, the term of this patent is extended or adjusted under 35 U.S.C. 154(b) by 1 day.

(21) Appl. No.: 09/995,418

(22) Filed: Nov. 27, 2001

(65) Prior Publication Data

US 2004/0046154 A1 Mar. 11, 2004

(51) Int. Cl.$^7$ .............................. C01J 1/00; B05D 5/12; H01B 1/02; C08K 3/08
(52) U.S. Cl. .................... 106/170.58; 427/74; 427/123; 427/126.1; 427/189; 427/197; 427/201; 427/256; 427/372.2; 252/512; 252/514; 524/440; 524/441
(58) Field of Search ........................ 427/58, 123, 126.7, 427/189, 256, 282, 372.2, 74, 197, 201; 106/170.58; 252/512, 514; 524/440, 441

(56) References Cited

U.S. PATENT DOCUMENTS

| | | | |
|---|---|---|---|
| 3,655,545 A | | 4/1972 | Gillery et al. |
| 3,962,488 A | | 6/1976 | Gillery |
| 4,219,448 A | * | 8/1980 | Ross ........................... 252/500 |
| 4,243,710 A | | 1/1981 | Magrini et al. ............. 428/208 |
| 4,730,556 A | | 3/1988 | Cobbs, Jr. ................... 101/129 |
| 4,768,037 A | | 8/1988 | Inaba et al. |
| 4,849,766 A | | 7/1989 | Inaba et al. |
| 4,898,789 A | | 2/1990 | Finley |
| 4,992,801 A | | 2/1991 | Saito et al. |
| 5,083,134 A | | 1/1992 | Saitou et al. |
| 5,083,135 A | | 1/1992 | Nagy et al. |
| 5,286,288 A | * | 2/1994 | Tobias et al. ............. 106/31.29 |
| 5,320,684 A | * | 6/1994 | Amick et al. ................ 136/256 |
| 5,346,651 A | * | 9/1994 | Oprosky et al. ............. 252/514 |
| 5,346,933 A | | 9/1994 | Knell |
| 5,355,144 A | | 10/1994 | Walton et al. |
| 5,411,768 A | | 5/1995 | Knell et al. |
| 5,416,491 A | | 5/1995 | Nishikawa et al. |
| 5,528,314 A | | 6/1996 | Nagy et al. |
| 5,646,637 A | | 7/1997 | Miller |
| 5,648,758 A | | 7/1997 | Tweadey, II et al. |
| 5,670,966 A | | 9/1997 | Dishart et al. |
| 5,698,451 A | * | 12/1997 | Hanoka ........................ 438/98 |
| 5,748,155 A | | 5/1998 | Kadunce et al. |
| 5,999,136 A | | 12/1999 | Winter et al. |
| 6,124,401 A | | 9/2000 | Hart, Jr. et al. .............. 525/108 |

FOREIGN PATENT DOCUMENTS

DE    3804831    * 7/1989

* cited by examiner

Primary Examiner—Brian K. Talbot
(74) Attorney, Agent, or Firm—Rankin, Hill, Porter & Clark LLP

(57) ABSTRACT

The present invention provides a hot melt conductor paste composition that includes conductive particles and glass particles dispersed in a thermoplastic polymer system. The hot melt conductor paste composition according to the invention is a solid at room temperature, but melts at a temperature of from about 35° C. to about 90° C. to form a flowable liquid that can be applied to a silicon substrate by screen printing. The hot melt conductor paste composition is particularly suitable for use in the fabrication of photovoltaic cells.

21 Claims, No Drawings

HOT MELT CONDUCTOR PASTE COMPOSITION

FIELD OF THE INVENTION

The present invention provides a hot melt conductor paste composition that is particularly useful for forming electrically conductive patterns in photovoltaic cells.

BACKGROUND OF THE INVENTION

Conventional conductive pastes used in the electronic materials market are liquids at room temperature. Such pastes typically consist of conductive powders or flakes dispersed in a liquid vehicle. Such pastes are applied to substrates by conventional screen printing methods, pad printing, extrusion, dispensing, or other conventional application methods, which are well known.

One of the problems associated with the use of such conventional conductive pastes is that such pastes must be forced dried, typically in an oven, before additional electronic material pastes can be applied and/or before any additional processing operations can be performed on the component being formed. The forced drying step takes time and energy, and can result in the release of volatile organic compounds. Furthermore, the repeated handling of the components during drying operations can lead to component breakage.

Magrini et al., U.S. Pat. No. 4,243,710, disclose a thermoplastic electrode ink for use in the manufacture of ceramic multi-layer capacitors. The thermoplastic electrode ink composition according to Magrini et al. includes finely divided ternary (Ag/Pt/Pd or Pt/Pd/Au) or binary (Ag/Pd) metal powders dispersed in a thermoplastic medium that is a solid at room temperature. Upon heating to a temperature between 100° F. to 250° F., the thermoplastic electrode ink composition according to Magrini et al. melts to form a flowable ink that can be applied by screen printing to sheets of dielectric ware, which are then laminated into multi-layer capacitors without a drying step.

It would be highly advantageous to use a thermoplastic electrode ink composition such as disclosed in Magrini et al. in applications other than the fabrication of multi-layer ceramic capacitors. Unfortunately, however, an electrode ink composition according to Magrini et al. will not sufficiently adhere to certain substrates such as single crystal silicon and polycrystalline silicon (hereinafter simply silicon), which are commonly used in the fabrication of photovoltaic cells and the like. Furthermore, such thermoplastic electrode ink compositions will not meet the electrical requirements needed in such applications.

SUMMARY OF INVENTION

The present invention provides a conductive composition that is a solid at room temperature (~25° C.), but which melts at a temperature of from about 35° C. to about 90° C. to form a flowable liquid that can be applied to a silicon substrate by screen printing. The composition according to the invention does not need to be force dried after application because it rapidly solidifies and adheres to the substrate after printing. The solidified screen printed pattern can withstand rigorous part handling without detaching from the substrate or becoming dented or broken. Subsequent electronic material paste layers can be immediately applied directly over the solidified screen printed pattern.

The hot melt conductor paste composition according to the invention comprises conductive particles and glass particles dispersed in a thermoplastic polymer system. The conductive particles preferably comprise either silver or aluminum, and can be in the form of powders and/or flakes. The glass particles preferably comprise one or more glass frits having the following composition by weight: from about 60% to about 95% PbO, up to about 30% $SiO_2$, up to about 15% $B_2O_3$, up to about 10% $Al_2O_3$, up to about 10% $ZrO_2$, up to about 5% $P_2O_5$, and up to about 5% $RuO_2$. The thermoplastic polymer system preferably comprises a blend of from about 50% to about 90% by weight of one or more fatty alcohols, from about 5% to about 20% by weight of one or more cellulose ethers, and optionally up to about 10% by weight wood rosin and/or soy lecithin. The composition also preferably comprises at least about 0.01% by weight up to about 5% by weight of one or more $C_{12}$ or higher saturated fatty acids.

The foregoing and other features of the invention are hereinafter more fully described and particularly pointed out in the claims, the following description setting forth in detail certain illustrative embodiments of the invention, these being indicative, however, of but a few of the various ways in which the principles of the present invention may be employed.

DETAILED DESCRIPTION OF PREFERRED EMBODIMENTS

The hot melt conductor paste composition according to the invention comprises conductive particles and glass particles dispersed in a thermoplastic polymer system. The conductive particles preferably comprise either silver or aluminum, but other materials such as copper and dielectrics can be used. The conductive particles can be in the form of powders and/or flakes. Alloys containing silver can also be used. The loading of conductive particles in the composition is preferably from about 50% to about 90% by weight based upon the total weight of all components in the composition.

The conductive particles used in the hot melt conductive paste composition according to the invention preferably have a small average particle size, preferably less than 5 μm, which is particularly important if the composition is being applied by screen printing. More preferably, the conductive particles have a bimodal particle size distribution, which aids in improving the packing and thus the density of conductive particles in the paste. In the preferred embodiment of the invention, a majority portion (i.e., greater than 50% by weight) of the conductive particles have a $D_{50}$ of less than 2.5 μm and a minority portion of the conductive particles have a $D_{50}$ of greater than about 2.5 μm but less than about 5.0 μm.

The glass particles used in the hot melt conductor paste composition preferably comprise one or more glass frits. When the conductive particles comprise silver and the paste composition is being applied to a silicon substrate, the glass particles preferably have the following composition by weight: from about 60% to about 95% PbO, up to about 30% $SiO_2$, up to about 15% $B_2O_3$, up to about 10% $Al_2O_3$, up to about 10% $ZrO_2$, up to about 5% $P_2O_5$, and up to about 5% $RuO_2$. More preferably, the glass particles have the following composition by weight: from about 75% to about 92% PbO, from about 10% to about 20% $SiO_2$, up to about 7% $B_2O_3$, up to about 5% $Al_2O_3$, up to about 6% $ZrO_2$, up to about 3% $P_2O_5$, and up to about 3% $RuO_2$. In the presently most preferred embodiment of the invention, the glass frit comprises by weight 81.16% PbO, 10.72% $SiO_2$, 4.11% $B_2O_3$, 2.81% $Al_2O_3$, and 1.20% $ZrO_2$ (hereinafter Ferro EG09014).

When the conductive particles comprise aluminum, the composition of the glass particles is not as critical. In some instances, it is possible to use finely milled silica as the glass particles.

The glass particles aid in bonding the conductor to the substrate. The least amount of glass particles necessary to obtain good adhesion should be used. Loadings of less than about 50%, preferably less than about 20%, and more preferably less than about 10%, based upon the total weight of the composition are typically satisfactory.

The conductive particles and glass particles are dispersed in a thermoplastic polymer system that is a solid at 25° C. and melts at a temperature less than about 70° C. The composition of the thermoplastic polymer system is not per se critical, and a variety of thermoplastic polymer systems can be used including, for example, the thermoplastic medium disclosed in Magrini et al., U.S. Pat. No. 4,243,710, which is hereby incorporated by reference.

Preferably, the thermoplastic polymer system comprises at least one $C_{14}$ or higher linear primary alcohol. More preferably, the thermoplastic polymer system comprises a blend of two or more different $C_{14}$ to $C_{20}$ linear primary alcohols. Suitable alcohols can be obtained, for example, from CONDEA Vista under the ALFOL trade A designation. The thermoplastic polymer system also preferably further comprises one or more cellulose ethers. The presently most preferred cellulose ether is ethyl cellulose. Optional components that can be added to the thermoplastic polymer system include partially hydrogenated rosin, soy lecithin, and various surfactants.

Applicants have discovered that unless at least 0.01% by weight of one or more $C_{12}$ or higher saturated fatty acids is present in the composition, the conductive particles will tend to coagulate into a mass that resembles cottage cheese when the temperature is maintained above the melting point of the thermoplastic polymer system. The use of a small amount (typically less than about 5% by weight based upon the total weight of the composition) of one or more $C_{12}$ or higher saturated fatty acids prevents the coagulation of the silver or aluminum particles and extends the "at-temperature" life of the hot melt conductor paste composition indefinitely. The preferred saturated fatty acid for use in the invention is isostearic acid. However, other acids such as oleic acid, for example, can also be used.

In one preferred embodiment of the invention, the hot melt conductor paste composition comprises: from about 40% to about 80% by weight of a blend of a majority portion by weight of silver flakes having a $D_{50}$ of less than 2.5 $\mu$m and minority portion by weight of silver flakes having a $D_{50}$ of greater than about 2.5 $\mu$m but less than about 5.0 $\mu$m; and from about 10% to about 50% by weight of glass powder comprising at least one glass frit comprising by weight from about 75% to about 92% PbO, from about 10% to about 20% $SiO_2$, from about 0% to about 7% $B_2O_3$, up to about 5% $Al_2O_3$, up to about 6% $ZrO_2$, up to about 3% $P_2O_5$, and up to about 3% $RuO_2$, dispersed in a thermoplastic polymer system comprising one or a blend of two or more different $C_{16}$ to $C_{18}$ linear primary alcohols, ethyl cellulose, partially hydrogenated wood rosin, and soy lecithin. The composition also includes at least about 0.01% by weight isostearic acid. The preferred $C_{16}$ to $C_{18}$ linear primary alcohols are cetyl alcohol and stearyl alcohol, respectively.

In another preferred embodiment of the invention, the hot melt conductor paste composition comprises: from about 50% to about 90% by weight aluminum powder having an average particle size of less than 5.5 $\mu$m; and from about 10% to about 50% by weight of glass powder comprising silica. The aluminum powder and silica is dispersed in a thermoplastic polymer system comprising at least one $C_{16}$ or higher linear primary alcohol, ethyl cellulose, partially hydrogenated wood rosin, and soy lecithin. The composition comprises at least about 0.01% by weight isostearic acid. The preferred linear primary alcohol is cetyl alcohol.

The hot melt conductor paste composition according to the invention is preferably formed by mixing the components of the thermoplastic polymer system together at a temperature slightly above the melting point of the material. When silver particles are used as the conductive material, the silver powder and glass particles are added to the thermoplastic polymer system under high mixing conditions and then the paste is passed through a three roll mill heated up to about 70° C. to ensure that there are no large particles or agglomerations. When aluminum particles are used as the, conductive material, the aluminum hot melt mixture will undergo high speed mixing conditions but typically not pass through a three roll mill. The saturated fatty acid can be added to the composition at any time either before or after the conductive particles and/or glass particles have been added to the molten thermoplastic polymer system. Preferably, however, the saturated fatty acid is added after the conductive particles.

The present invention also provides a method of forming a conductive pattern on a photovoltaic cell. The method comprises heating a hot melt conductor paste composition according to the invention to a temperature above the melting point of the thermoplastic polymer system but below the temperature at which thermoplastic polymer system begins to substantially volatilize; applying the hot melt conductor paste composition to a silicon substrate by screen printing, pad printing, extrusion, dispensing, or any other conventional application method; and firing the substrate to completely burn out all organic material is said hot melt conductor paste composition and form said conductive pattern. Firing temperatures are not per se critical. Firing temperatures should be high enough to completely burn out the organic material in the paste and fuse the conductive particles and glass particles to the substrate. In photovoltaic cell fabrication applications, firing is typically conducted at a temperature of from about 650° C. to about 900° C. for about 20 seconds at peak temperature.

The hot melt conductor paste composition according to the invention is particularly useful in the fabrication of electronic devices such as photovoltaic cells and the like. Unlike conventional conductive pastes that are liquids at room temperature (e.g., ~25° C.), the hot melt conductor paste composition according to the present invention is a solid at room temperature (~25° C.), which simplifies handling and storage. The thermoplastic polymer system melts into a flowable liquid state at a moderately low temperature thereby allowing for the rapid application of the paste to substrates using screen printing, pad printing, extrusion, or other conventional application methods and equipment. The viscosity of the paste can be directly controlled by adjusting the temperature (e.g., to lower the viscosity one need merely to raise the temperature).

The hot melt conductor paste composition according to the invention provides a substantial increase in the rate of electronic component production. The melted paste rapidly solidifies after application to the substrate and thus requires no subsequent drying step. The solidified pattern stands up to rigorous part handling without smudging or moving. In fact, other electronic paste materials can be applied directly over the printed substrate in only a few seconds after application of the melted paste. This provides a substantial advantage over the use of conventional conductive pastes that are liquids at mom temperature, which must be forced dried in ovens before additional processing can be completed. The elimination of the need for drying thus increases component production speed and further reduces component loss due to breakage from handling.

Another advantage of the hot melt conductor paste composition according to the invention is that the paste does not produce volatile organic compounds during component fabrication. The components of the thermoplastic polymer system are non-hazardous and do not evaporate when heated at the preferred application temperatures. The majority of the organic materials used in the paste composition do not evaporate or volatilize until subjected to firing conditions, where the materials can be completely combusted into non-hazardous products. The absence of volatile compounds in the composition increase the shelf life and stability of the composition as compared to conventional conductive inks that are liquids at room temperature.

As noted above, the hot melt conductor paste composition according to the invention is particularly well-suited for application to substrates using well-known screen printing techniques among other techniques. Although conventional screen printing equipment can be used, it is preferable for the screen, stage, and squeegee to be heated. It will be appreciated that the particular heating screen, stage, and squeegee heating temperatures will be dictated by the melt temperature of the hot melt paste, the desired viscosity of the melted paste, and the surface cosmetics to be achieved in the printed pattern. For example, when a hot melt conductor paste composition is used that melts within the range of from about 35° C. to about 90° C., the screen temperature will preferably be maintained within the range of from about 40° C. to about 90° C., the stage temperature is maintained within the range of from about 30° C. to about 65° C., and the squeegee temperature is maintained up to about 65° C. By optimizing the temperature parameters for the application equipment, the hot melt conductor paste composition can be used to screen print, pad print, extrude, or dispense conductive patterns having excellent print cosmetics.

The following examples are intended only to illustrate the Invention and should not be construed as imposing limitations upon the claims.

EXAMPLE 1

The various components in the amounts shown in Table 1 below were heated together to a maximum temperature of 70° C. and gently mixed to form a molten thermoplastic polymer system.

TABLE 1

| Component | Amount (wt. %) |
|---|---|
| stearyl alcohol (CONDEA Vista ALFOL 18NF) | 59.29 |
| cetyl alcohol (CONDEA Vista ALFOL 16NF) | 21.81 |
| ethyl cellulose (Hercules AQUALON N22 0100) | 13.15 |
| partially hydrogenated rosin (Eastman STAYBELITE) | 4.75 |
| soy lecithin (ADM Lecithin RR551) | 1.00 |

EXAMPLE 2

A hot melt conductor paste composition according to the invention was formed by mixing the various components in the amounts shown in Table 2 below in a jacketed high speed mixer at 70° C. for 1 hour. The molten thermoplastic polymer system from Example 1 was the first component charged to the heated mixing chamber. After mixing, the resulting paste was passed through a three roll mill three times and then allowed to cool to room temperature (~25° C.). A solid hot melt conductor paste composition according to the invention was obtained.

TABLE 2

| Component | Amount (wt. %) |
|---|---|
| silver flake ($D_{50}$ 1.6 μm) (Technic SILFLAKE 241) | 49.94 |
| silver flake ($D_{50}$ 2.8 μm) (Metalor Technologies VA-0004) | 26.00 |
| thermoplastic polymer system (from Example 1 above) | 19.66 |
| glass frit (Ferro EG09014) | 4.10 |
| isostearic acid (Pfaltz & Bauer I11150) | 0.30 |

EXAMPLE 3

The hot melt conductor paste composition formed in Example 2 above was heated to a temperature of 65° C. and then screen printed onto a silicon substrate using a 325 mesh screen to form a conductor pattern. The conductor pattern solidified onto the substrate within a few seconds after the screen was removed. The screen printed substrate was then placed into an oven and fired at a temperature of about 650° C. to about 900° C. for about 20 seconds at peak temperature to bum out all organic material in the ink composition and fuse the metal and glass particles together and adhere the conductor pattern to the substrate. After firing, the substrate was permitted to cool to room temperature (~25° C.). A fully functional silver conductor pattern was formed on the substrate.

EXAMPLE 4

The various components in the amounts shown in Table 3 below were heated together to a maximum temperature of 55° C. and gently mixed to form a molten thermoplastic polymer system.

TABLE 3

| Component | Amount (wt. %) |
|---|---|
| cetyl alcohol (CONDEA Vista ALFOL 16NF) | 81.10 |
| ethyl cellulose (Hercules AQUALON N10) | 13.15 |
| partially hydrogenated rosin (Eastman STAYBELITE) | 4.75 |
| soy lecithin (ADM Lecithin RR551) | 1.00 |

EXAMPLE 5

A hot melt aluminum conductor paste composition according to the invention was formed by mixing the various components in the amounts shown in Table 4 below in a jacketed high speed mixer at 55° C. for 1 hour. The molten thermoplastic polymer system from Example 4 was the first component charged to the heated mixing chamber. After mixing, the conductor paste was allowed to cool to room temperature (~25° C.). A solid hot melt conductor paste composition according to the invention was obtained.

TABLE 4

| Component | Amount (wt. %) |
|---|---|
| aluminum powder ($D_{50}$ 4.5 μm) (Eckart America 400 ATOMIZED POWDER) | 71.30 |
| thermoplastic polymer system (from Example 4 above) | 27.70 |
| glass frit (U.S. Silica MINUSIL 5) | 0.70 |
| isostearic acid (Pfaltz & Bauer I11150) | 0.30 |

EXAMPLE 6

The hot melt conductor paste composition formed in Example 5 above was heated to a temperature of 55° C. and then screen printed onto a silver hot melt printed silicon substrate using a 325 mesh screen to form a co-printed conductor pattern. The conductor pattern solidified onto the substrate within a few seconds after the screen was removed. The screen printed substrate was then placed into an oven and fired at a temperature of about 650° C. to 900° C. for about 20 seconds at peak temperature to burn out all organic material in the ink composition and fuse the metal and glass particles together and adhere to the substrate. After firing, the substrate was permitted to cool to room temperature (~25° C.). A fully functional aluminum conductor pattern was formed on the substrate.

Additional advantages and modifications will readily occur to those skilled in the art. Therefore, the invention in its broader aspects is not limited to the specific details and illustrative examples shown and described herein. Accordingly, various, modifications may be made without departing from the spirit or scope of the general inventive concept as defined by the appended claims and their equivalents.

What is claimed:

1. A hot melt conductor paste composition comprising from about 50% to about 90% by weight of conductive particles consisting essentially of either silver or aluminum and up to about 50% by weight of glass particles dispersed in a thermoplastic polymer system, wherein the paste composition is a solid at 25° C. and melts at a temperature within the range of from about 35° C. to about 90° C.

2. The hot melt conductor paste composition according to claim 1 further comprising at least 0.01% by weight of one or more $C_{12}$ or higher saturated fatty acids.

3. The hot melt conductor paste composition according to claim 1 wherein said glass particles comprise at least one glass frit comprising by weight from about 60% to about 95% PbO, up to about 30% $SiO_2$, up to about 15% $B_2O_3$, up to about 10% $Al_2O_3$, up to about 10% $ZrO_2$, up to about 5% $P_2O_5$, and up to about 5% $RuO_2$.

4. The hot melt conductor paste composition according to claim 1 wherein said conductive particles have a bi-modal particle size distribution.

5. The hot melt conductor paste composition according to claim 1 wherein a majority portion of said conductive particles comprise flakes having a $D_{50}$ of less than about 5.0 μm.

6. The hot melt conductor paste composition according to claim 3 wherein said glass frit comprises by weight from about 75% to about 92% PbO, from about 10% to about 20% $SiO_2$, up to about 7% $B_2O_3$, up to about 5% $Al_2O_3$, up to about 6% $ZrO_2$, up to about 3% $P_2O_5$, and up to about 3% $RuO_2$.

7. The hot melt conductor paste composition according to claim 1 wherein said thermoplastic polymer system comprises at least one $C_{14}$ or higher linear primary alcohol.

8. The hot melt conductor paste composition according to claim 7 wherein said thermoplastic polymer system comprises a blend of two or more different $C_{14}$ to $C_{20}$ linear primary alcohols.

9. The hot melt conductor paste composition according to claim 7 wherein said thermoplastic polymer system further comprises one or more cellulose ethers.

10. The hot melt conductor paste composition according to claim 9 wherein said cellulose ether comprises ethyl cellulose.

11. The hot melt conductor paste composition according to claim 2 wherein said $C_{12}$ or higher saturated fatty acid comprises isostearic acid.

12. The hot melt conductor paste composition according to claim 1 wherein said conductive particles comprise a blend of a majority portion by weight of silver flakes having a $D_{50}$ of less than 2.5 μm and a minority portion by weight of flakes having a $D_{50}$ of greater than about 2.5 μm, wherein said glass particles comprise a glass frit comprising by weight from about 75% to about 92% PbO, from about 10% to about 20% $SiO_2$, up to about 7% $B_2O_3$, up to about 5% $Al_2O_3$, up to about 6% $ZrO_2$, up to about 3% $P_2O_5$, and up to about 3% $RuO_2$, and wherein said thermoplastic polymersystem comprises a blend of two or more different $C_{16}$ to $C_{18}$ linear primary alcohols and ethyl cellulose.

13. The hot melt conductor paste composition according to claim 12 further comprising at least about 0.1% by weight of one or more $C_{12}$ or higher saturated fatty acids.

14. The hot melt conductor paste composition according to claim 1 wherein said conductive particles comprise aluminum flakes having a $D_{50}$ of less than about 5.5 μm, wherein said glass particles comprise silica, and wherein said thermoplastic polymer system comprises a blend of at least one $C_{16}$ or higher linear primary alcohol and ethyl cellulose.

15. The hot melt conductor paste composition according to claim 14 further comprising at least about 0.1% by weight of one or more $C_{12}$ or higher saturated fatty acids.

16. A method of forming a conductive pattern on a photovoltaic cell comprising:

providing a hot melt conductor paste composition comprising from about 50% to about 90% by weight of conductive particles consisting essentially of either silver or aluminum and up to about 50% by weight of glass particles dispersed in a thermoplastic polymer system, wherein the paste composition a solid at 25° C. and melts at a temperature within the range of from about 35° C. to about 90° C.;

heating said hot melt conductor paste composition to a temperature above the melting point of the thermoplastic polymer system but below the temperature at which said thermoplastic polymer system begins to substantially volatilize;

applying said hot melt conductor paste composition to a silicon substrate by screen printing, pad printing, extrusion, or dispensing; and firing said substrate to completely burn out all organic material is said hot melt conductor paste composition and form said conductive pattern.

17. The method according to claim 16 wherein said hot melt conductor paste is applied by screen printing to said substrate using a screen having a mesh size within the range of from 100 mesh to about 400 mesh.

18. The method according to claim 16 wherein said firing temperature is within the range of from about 650° C. to about 900° C.

19. The method according to claim 16 wherein said conductive particles comprise a blend of a majority portion by weight of silver flakes having a $D_{50}$ of less than 2.5 μm and a minority portion by weight of flakes having a $D_{50}$ of greater than about 2.5 μm, wherein said glass particles comprise a glass frit comprising by weight from about 75% to about 92% PbO, from about 10% to about 20% $SiO_2$, up to about 7% $B_2O_3$, up to about 5% $Al_2O_3$, up to about 6% $ZrO_2$, up to about 3% $P_2O_5$, and up to about 3% $RuO_2$, and wherein said thermoplastic polymer system comprises a blend of two or more different $C_{16}$ to $C_{18}$ linear primary alcohols and ethyl cellulose, and wherein said composition further comprises at least about 0.01% by weight of one or more $C_{12}$ or higher saturated fatty acids.

20. The method according to claim 16 wherein said conductive particles comprise aluminum flakes having a $D_{50}$ of less than about 5.5 μm, wherein said glass particles comprise silica, and wherein said thermoplastic polymer system comprises a blend of at least one $C_{16}$ or higher linear primary alcohol and ethyl cellulose, and wherein said composition further comprises at least about 0.01% by weight of one or more $C_{12}$ or higher saturated fatty acids.

21. A method of forming a conductive pattern on a photovoltaic cell comprising:

providing a hot melt conductor paste composition comprising from about 50% to about 90% by weight of conductive particles consisting essentially of either silver or aluminum and up to about 50% by weight of glass particles dispersed in a thermoplastic polymer system, wherein the hot melt conductor paste composition is a solid at 25° C. and melts at a temperature within the range of from about 35° C. to about 90° C.;

heating the hot melt conductor paste composition to a temperature above the melting point of the thermoplastic polymer system but below the temperature at which the thermoplastic polymer system begins to substantially volatilize;

applying the hot melt conductor paste composition to a silicon substrate by screen printing, pad printing, extrusion, or dispensing;

allowing the hot melt conductor paste composition to cool to a temperature below the melting point of the thermoplastic polymer system such that it solidifies on the silicon substrate;

applying an additional electronic paste material onto the solidified hot melt conductor paste composition; and firing the silicon substrate to completely burn out all organic material is the hot melt conductor paste composition and form the conductive pattern.

* * * * *